(12) United States Patent
Lee et al.

(10) Patent No.: US 12,113,437 B2
(45) Date of Patent: Oct. 8, 2024

(54) POWER NOISE FILTER AND SUPPLY MODULATOR INCLUDING THE SAME

(71) Applicant: SAMSUNG ELECTRONICS CO., LTD., Suwon-si (KR)

(72) Inventors: Jeong Kwang Lee, Hwaseong-si (KR); Young Hwan Choo, Daejeon (KR); Dong Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 17/658,317

(22) Filed: Apr. 7, 2022

(65) Prior Publication Data

US 2023/0006543 A1    Jan. 5, 2023

(30) Foreign Application Priority Data

Jul. 5, 2021  (KR) .................. 10-2021-0087558

(51) Int. Cl.
| | |
|---|---|
| *H03H 1/00* | (2006.01) |
| *H02M 1/096* | (2006.01) |
| *H02M 1/44* | (2007.01) |
| *H03H 9/52* | (2006.01) |
| *H03H 9/64* | (2006.01) |

(52) U.S. Cl.
CPC ............. *H02M 1/44* (2013.01); *H02M 1/096* (2013.01); *H03H 1/0007* (2013.01); *H03H 9/52* (2013.01); *H03H 9/6489* (2013.01)

(58) Field of Classification Search
CPC .............................. H03H 1/0007; H03H 9/52
See application file for complete search history.

(56) References Cited

U.S. PATENT DOCUMENTS

| | | | |
|---|---|---|---|
| 7,339,446 B2 * | 3/2008 | Su ................. | H03H 7/1783 333/132 |
| 7,508,284 B2 | 3/2009 | Shafer | |
| 7,528,678 B2 | 5/2009 | Tamura et al. | |
| 7,646,264 B2 | 1/2010 | Petrovic | |
| 8,306,499 B2 * | 11/2012 | Yamakawa ......... | H04N 21/426 455/307 |
| 8,824,978 B2 | 9/2014 | Briffa et al. | |
| 10,193,500 B2 * | 1/2019 | Kim ..................... | H03F 1/0227 |
| 10,644,651 B1 * | 5/2020 | Kim ......................... | H03F 3/24 |
| 10,686,407 B2 * | 6/2020 | Nomiyama ............ | H03F 3/21 |

(Continued)

FOREIGN PATENT DOCUMENTS

| | | | | |
|---|---|---|---|---|
| CN | 115208192 A | * | 10/2022 | ............ H02M 1/008 |
| EP | 3955461 A1 | * | 2/2022 | ............ H02M 1/126 |

*Primary Examiner* — Sisay G Tiku
(74) *Attorney, Agent, or Firm* — CHAU & ASSOCIATES, LLC

(57) ABSTRACT

A power noise filter and a supply modulator including the same, and a wireless communication device including the power noise filter are provided. The power noise filter includes a band stop filter and a low pass filter. The band stop filter includes an inductor and a first capacitor, which are connected in parallel between first and second nodes. The first node receives a first voltage, which is filtered by the band pass filter to thereby generate a second voltage at the second node. The first low pass filter includes the inductor and a second capacitor, which has one end connected to the second node and an opposite end connected to a ground source.

21 Claims, 15 Drawing Sheets

(56) References Cited

U.S. PATENT DOCUMENTS

| | | |
|---|---|---|
| 2006/0135071 A1 | 6/2006 | Kim |
| 2014/0035702 A1 | 2/2014 | Black et al. |
| 2018/0034416 A1* | 2/2018 | Duncan ................. H03F 1/0216 |
| 2019/0334480 A1* | 10/2019 | Nomiyama ............... H03F 3/19 |
| 2020/0007177 A1 | 1/2020 | Ripley et al. |
| 2020/0411287 A1 | 12/2020 | Gu et al. |
| 2021/0005434 A1* | 1/2021 | Kim .................. H01L 21/67248 |
| 2021/0020412 A1 | 1/2021 | Kim et al. |
| 2021/0328562 A1* | 10/2021 | Ishihara .................. H03F 3/195 |

* cited by examiner 240-7

240-8

POWER NOISE FILTER AND SUPPLY MODULATOR INCLUDING THE SAME

CROSS-REFERENCE TO RELATED APPLICATION

This application claims priority to Korean Patent Application No. 10-2021-0087558, filed on Jul. 5, 2021 in the Korean Intellectual Property Office, and all the benefits accruing therefrom under 35 U.S.C. § 119, the disclosure of which is incorporated herein by reference in its entirety.

TECHNICAL FIELD

The present disclosure relates generally to a "power noise" filter for filtering out power supply noise, and to a supply modulator and a wireless communication device including the power noise filter.

DESCRIPTION OF THE RELATED ART

Wireless communication devices such as smartphones, tablets, laptops, and Internet-of-Things (IoT) devices use various technologies for high-speed communication such as Wideband Code Division Multiple Access (WCDMA) ($3^{rd}$ Generation (3G)), Long Term Evolution (LTE), LTE Advanced (LTE A) ($4^{th}$ Generation (4G)), and $5^{th}$ Generation (5G) mobile communication technology. As communication technology develops, high peak-to-average power ratios (PAPRs) and wide bandwidths for signals are required. Without remedial measures, high PAPRs and wide bandwidths tend to reduce efficiency of a transmit side power amplifier, which is typically powered by a battery. The reduction in efficiency may lead to undesirable battery drain.

To improve the efficiency of power amplifiers at high PAPRs and at wide bandwidths, techniques such as Average Power Tracking (APT) or Envelope Tracking (ET) may be used. The efficiency and linearity of power amplifiers can be improved using ET. Circuitry employed for APT and ET are often referred to as supply modulators.

Digital supply modulators receive analog signals and generate discrete signals, such that the need for power noise filtering for unnecessary noise generated in the discrete signals arises.

SUMMARY

Embodiments of the present disclosure provide a power noise filter with an improved power noise filtering effect.

Embodiments of the present disclosure also provide a supply modulator with an improved power noise filtering effect.

Embodiments of the present disclosure also provide a wireless communication device with an improved power noise filtering effect.

According to an embodiment of the present disclosure, there is provided a power noise filter including a band stop filter, and a first low pass filter. The band stop filter includes an inductor and a first capacitor, which are connected in parallel between first and second nodes. The first node receives a first voltage, which is filtered by the band stop filter to thereby generate a second voltage at the second node, and the low pass filter includes the inductor and a second capacitor, which has one end connected to the second node and an opposite end connected to a ground source.

According to an embodiment of the present disclosure, there is provided a supply modulator including: a direct current-to-direct current (DC-to-DC) converter receiving an envelope tracking signal and generating a maximum voltage corresponding to a maximum level of the envelope tracking signal, a linear voltage generator linearly converting and distributing the maximum voltage, a level selector generating an output voltage that fits the envelope tracking signal, and a power noise filter generating a power-amplified voltage by reducing or eliminating power noise in the output voltage. The power noise filter includes a band stop filter and a low pass filter, the band stop filter includes an inductor and a first capacitor, which are connected in parallel between first and second nodes, the first node receives the output voltage from the level selector, a filtered version of the first voltage is provided at the second node, and the first low pass filter includes the inductor and a second capacitor, which has one end connected to the second node and an opposite end connected to a ground source.

According to an embodiment of the present disclosure, there is provided a wireless communication device including: a modem generating an envelope tracking signal and a transmission signal, a radio frequency integrated circuit (RFIC) generating a radio frequency (RF) signal by modulating a carrier wave signal with the transmission signal, a power amplifier amplifying the radio frequency signal, and a supply modulator receiving the envelope tracking signal and transmitting a power-amplified voltage to the power amplifier, wherein the supply modulator includes a direct current-to-direct current (DC-to-DC) converter, which receives an envelope tracking signal and generates a maximum voltage of the envelope tracking signal, a linear voltage generator, which linearly converts and distributes the maximum voltage, a level selector, which generates an output voltage that fits the envelope tracking signal, and a power noise filter, which generates a supply voltage by reducing or eliminating power noise in the output voltage, and the power noise filter includes a band stop filter and a low pass filter, the band stop filter includes an inductor and a first capacitor, which are connected in parallel between first and second nodes, the first node receives the output voltage from the level selector, a filtered version of the first voltage is provided at the second node, and the first low pass filter includes the inductor and a second capacitor, which has one end connected to the second node and an opposite end connected to a ground source.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Herein, when a first electrical component is said to be "connected" to a second electrical component or a circuit node, one example of the connection is a direct electrical connection in which no intervening electrical components (with the exception of wiring or interconnects), e.g., as may be illustrated in an associated schematic diagram herein. However, an indirect connection in which one or more intervening components is present may be available in other embodiments, if the indirect connection would not be inconsistent with the functionality achieved with the direct connection.

Figure 1:
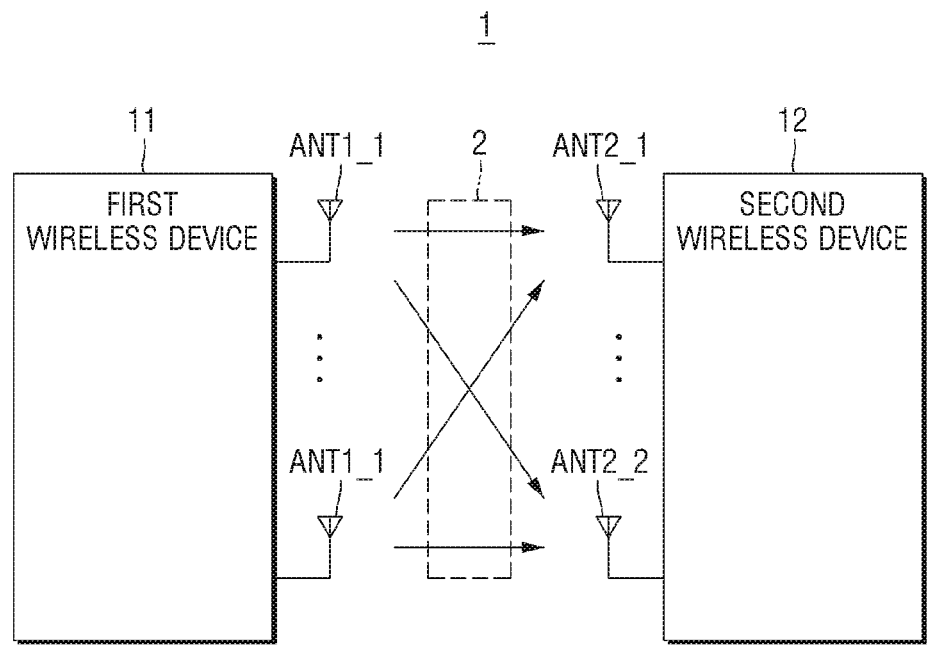
FIG. 1 is a block diagram of a wireless communication system according to some embodiments of the present disclosure.

FIG. 1 is a block diagram of a wireless communication system, 1, according to some embodiments of the present disclosure. The wireless communication system 1 may include first and second wireless communication devices 11 and 12. In a non-limiting example, the wireless communication system 1 may be a 5th Generation (5G) system, a Long Term Evolution (LTE), an LTE-Advanced (LTE-A) system, a Code Division Multiple Access (CDMA) system, a Global System for Mobile Communications (GSM), a wireless local area network (WLAN) system, a Wireless Fidelity (WiFi) system, a Bluetooth system, a magnetic secure transmission (MST) system, a radio frequency (RF) system, or a body area network (BAN) system.

Examples of the first and second wireless communication devices 11 and 12 may include various devices capable of communicating with each other to transmit data and/or control information to each other. For example, each of the first and second wireless communication devices 11 and 12 may be implemented as user equipment (UE) or a base station. UE may be a wireless communication device that may be either fixed or mobile and may also be referred to as terminal equipment, a mobile station (MS), a mobile terminal (MT), a user terminal (UT), a subscriber station (SS), a wireless device, or a handheld device. A base station may be a fixed station capable of communicating with the UE and/or with other BSs and may also be referred to as a Node B, an evolved Node B (eNB), or a base transceiver system (BTS). In another example, each of the first and second wireless communication devices 11 and 12 may be implemented as a client or an access point. A client may set a communication connection to an access point based on WiFi communication.

The first and second wireless communication devices 11 and 12 may communicate with each other in a multiple input multiple output (MIMO) manner. To this end, the first wireless communication device 11 may include a plurality of antennas ANT1_1 and ANT1_2, and the second wireless communication device 12 may include a plurality of antennas ANT2_1 and ANT2_2. In other embodiments, the first and/or second devices 11 and 12 has just a single transmitting antenna and/or a single receiving antenna.

Each of the first and second wireless communication devices 11 and 12 may operate as a transmitting device and/or a receiving device. When the first wireless communication device 11 operates as a transmitting device, the second wireless communication device 12 may operate as a receiving device, and when the second wireless communication device 12 operates as a transmitting device, the first wireless communication device 11 may operate as a receiving device. As described in detail below, the transmitter circuitry of the wireless communication device 11 and/or 12 may include a supply modulator that supplies a modulated supply voltage to bias a power amplifier. The modulated supply voltage may have a level that changes dynamically based on envelope signals and interface signals, thereby improving the efficiency of the power amplifier. In some embodiments, the modulated supply voltage is applied to multiple power amplifiers. The supply modulator may further include a power noise filter to filter out unwanted noise riding on the supply voltage waveform.

A wireless communication network or a spatial network 2 between the first and second wireless communication devices 11 and 12 may support communication between the first and second devices 11 and 12 by sharing available network resources. For example data may be transmitted in various manners over the network 2 such as CDMA, Frequency Division Multiple Access (FDMA), Time Division Multiple Access (TDMA), Orthogonal FDMA (OFDMA), or Single Carrier-FDMA (SC-FDMA). In the case of a spatial network, MIMO communication may be performed between devices 11 and 12.

Figure 2:
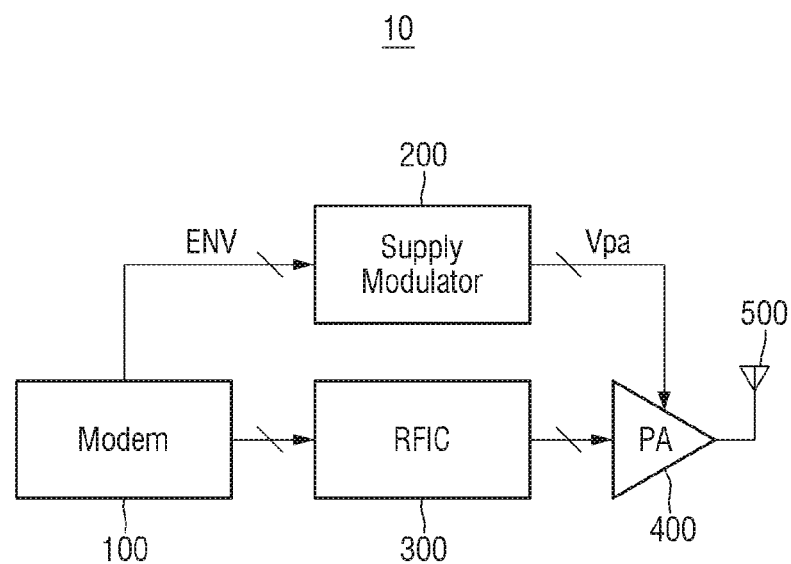
FIG. 2 is a block diagram of a wireless communication device according to some embodiments of the present disclosure.

FIG. 2 is a functional block diagram of a wireless communication device, 10, according to some embodiments of the present disclosure. The device 10 is an example of the first and/or second wireless communication devices 11 and 12. The wireless communication device 10 includes a modem 100, a supply modulator 200, a radio-frequency integrated circuit (RFIC) 300, a power amplifier ("PA") 400, and an antenna 500.

The modem 100 may include a digital transmission processor, a digital reception processor, a plurality of digital-to-analog converters (DACs), an analog-to-digital converter (ADC), and a mobile industry processor interface (MIPI).

The modem 100 may process a baseband signal (e.g., an I/Q signal) representing information to be transmitted via the digital transmission processor, in a predefined communication manner. The modem 100 may process a received baseband signal in a predefined communication manner via the digital reception processor. For example, the modem 100 may process a signal to be transmitted or a received signal in a communication manner such as Orthogonal Frequency Division Multiplexing (OFDM), OFDMA, Wideband CDMA (WCDMA), or evolved High Speed Packet Access (HSPA+). In other examples, the modem 100 may process baseband signals in various other communication manners to which a technique of modulating or demodulating the amplitude and/or frequency of baseband signals is applied.

The modem 100 may extract an envelope from a baseband signal via the digital transmission processor, convert an average power signal into an analog envelope signal via the DACs, and output the analog envelope signal. In this case, the modem 100 may provide the analog envelope signal to the supply modulator 200 as a reference voltage signal.

An envelope tracking signal ENV may be a differential signal including a positive signal and a negative signal.

The modem 100 may output a transmission signal representing information to be transmitted, to the RFIC 300.

The RFIC 300 may output an RF signal by modulating a carrier wave with the transmission signal output from the modem 100. The power amplifier 400 may amplify the RF signal to a required power level and transmit the amplified RF signal to another wireless communication device or a base station.

Examples of the supply modulator 200 will hereinafter be described with reference to FIGS. 3 through 16.

Figure 3:
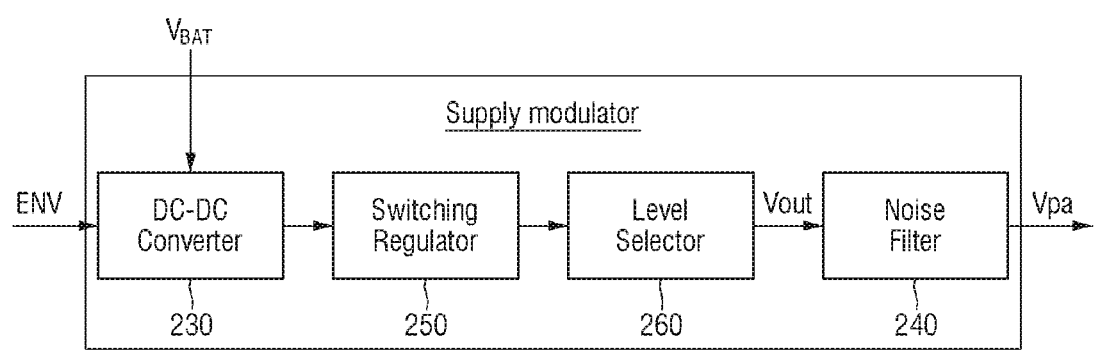
FIG. 3 is a block diagram of a supply modulator according to some embodiments of the present disclosure.
Figure 4:
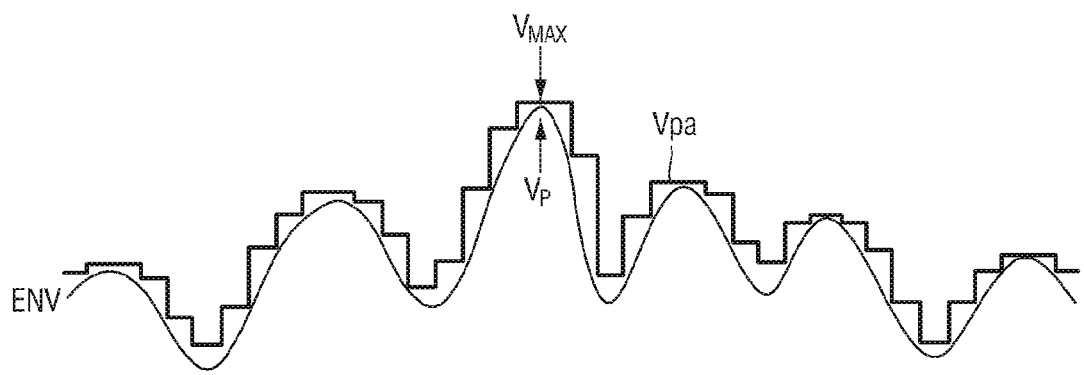
FIG. 4 is a graph for explaining the operation of a supply modulator according to some embodiments of the present disclosure.

FIG. 3 is a block diagram of a supply modulator according to some embodiments of the present disclosure. FIG. 4 is an example graph for explaining the operation of the supply modulator of FIG. 3. Referring to FIGS. 2-4, the supply modulator 200 may include a direct current (DC)-to-DC converter 230, a linear voltage generator 250, a level selector 260, and a power noise filter 240. The supply modulator 200 may receive the envelope tracking ENV from the modem 100, and a DC source voltage $V_{BAT}$, e.g., from a battery. The supply modulator 200 may generate, based on the voltages $V_{BAT}$ and ENV, a modulated power amplifier supply voltage Vpa (interchangeably, "supply voltage Vpa") to be supplied to the power amplifier 400. The supply voltage Vpa may have periodically changing discrete levels that track the time varying levels of the envelope tracking signal ENV.

The DC-to-DC converter 230 may receive the source voltage $V_{BAT}$ and generate therefrom a maximum voltage $V_{MAX}$ corresponding to a maximum voltage Vp of the envelope tracking signal ENV. (Although $V_{MAX}$ and Vp are illustrated at approximately the same level in FIG. 4 to facilitate understanding, $V_{MAX}$ and Vp may be different voltage levels.) For example, the DC-to-DC converter 230 may include an inductor, power switches, and/or load capacitors. The DC-to-DC converter 230 may be connected to a battery (supplying $V_{BAT}$ as a battery voltage) via the inductor and may store energy. Also, the DC-to-DC converter 230 may provide an intermediate voltage, which is based on the battery voltage, to the linear voltage generator 250. The DC-to-DC converter 230 may output $V_{MAX}$ or the maximum voltage Vp of the envelope tracking signal ENV to the linear voltage generator.

The linear voltage generator 250 may include a plurality of capacitor dividers, each of which may perform a step-up operation and a step-down operation on the maximum voltage $V_{MAX}$, to provide selectable voltages that proportionally track the envelope tracking signal ENV. In other words, the linear voltage generator 250 may linearly convert and distribute the maximum voltage received from the DC-to-DC converter 230.

The level selector 260 may include a plurality of switches. The level selector 260 may connect a voltage corresponding to the envelope tracking signal ENV, among various linear output voltages from the linear voltage generator 250, to an output voltage Vout, using the maximum voltage received from the DC-to-DC converter 230, and may provide power received from the DC-to-DC converter 230 as the output voltage Vout.

The output voltage Vout may include noise, which may be eliminated or reduced using the power noise filter 240, thereby generating the supply voltage Vpa. It is noted that the supply voltage Vpa may also be referred to as a bias voltage, as it may bias transistors within the power amplifier.

The supply voltage Vpa may be output from the supply modulator 200 to the power amplifier 400.

As illustrated in FIG. 4, the supply modulator 200 may generate the modulated supply voltage Vpa having time varying levels that track the envelope tracking signal ENV, using DC voltages having different levels. As illustrated, the supply voltage Vpa may have a stepped waveform that "fits" the envelope tracking signal ENV. By providing the supply voltage Vpa having a relatively lower level when the envelope signal ENV is relatively lower, efficiency of the power amplifier 400 may be substantially optimized at all times.

The supply voltage Vpa may have noise eliminated or reduced by the power noise filter 240. Example configurations and operation of power noise filters according to some embodiments of the present disclosure will hereinafter be described with reference to FIGS. 5 through 16.

Figure 5:
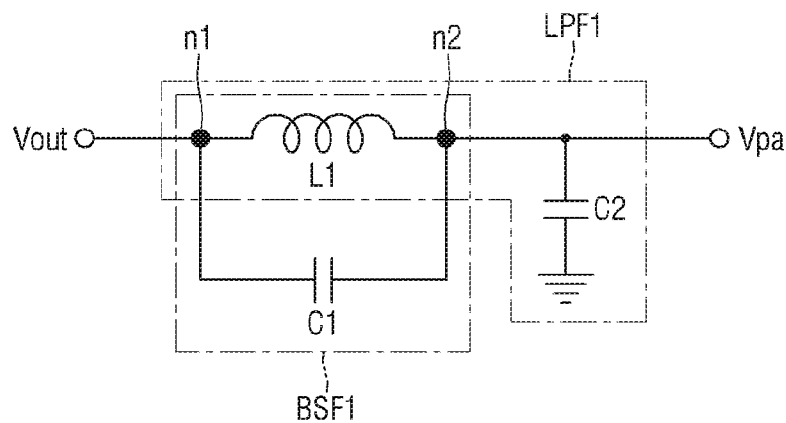
FIG. 5 is a circuit diagram of a power noise filter according to some embodiments of the present disclosure.

FIG. 5 is a circuit diagram of a power noise filter according to some embodiments of the present disclosure. As shown in FIG. 5, a power noise filter 240-1 includes a first band stop filter BSF1 and a first low pass filter LPF1. It is noted that a band stop filter may also be referred to as a notch filter.

The first band stop filter BSF1 includes a first inductor L1 and a first capacitor C1, which are connected in parallel between first and second nodes n1 and n2. The first node n1 may receive the output voltage Vout, and the second node n2 may output the supply voltage Vpa, which is obtained by reducing or eliminating noise in the output voltage Vout. The supply voltage Vpa is output, e.g., to the power amplifier 400 of FIG. 2. In other words, a first voltage (Vout) is received at the node n1, and the first band stop filter BSF1 filters the first voltage to generate a second voltage (Vpa) at the node n2, One end of the first inductor L1 is connected to the first node n1, and the other end of the first inductor L1 is connected to the second node n2. One end of the first capacitor C1 is connected to the first node n1, and the other end of the first capacitor C1 is connected to the second node n2.

The first band stop filter BSF1 may reduce or eliminate power in a particular frequency band. For instance, the first band stop filter BSF1 may eliminate or reduce power in a frequency band where noise in the output voltage Vout is excessive.

The first low pass filter LFP1 includes the first inductor L1 and a second capacitor C2, which are commonly connected to the second node n2. Specifically, one end of the second capacitor C2 may be connected to the second node n2, and the other end of the second capacitor C2 may be connected to a ground source.

The first low pass filter LPF1 may output the supply voltage Vpa with a spectrum that generates power in a desired low frequency band, and may reduce or eliminate power in other frequency bands.

Because the first band stop filter BSF1 and the first low pass filter LPF1 share the first inductor L1, the size of the power noise filter 240-1 can be minimized.

The supply voltage Vpa obtained by the power noise filter 240-1 will hereinafter be described with reference to FIG. 6.

Figure 6:
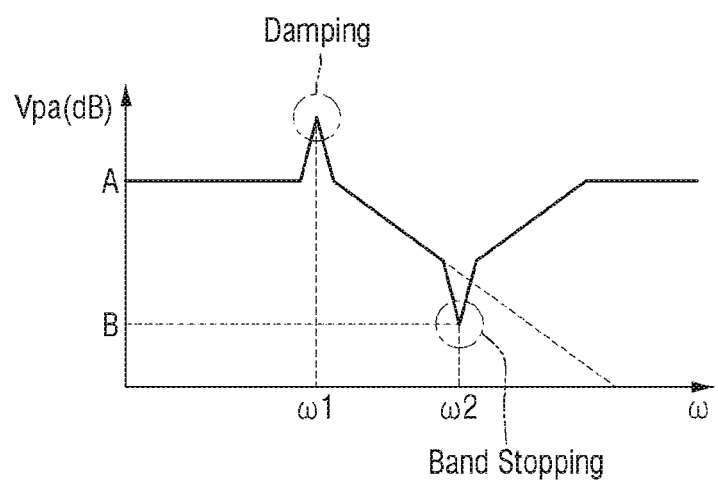
FIG. 6 is a Bode plot graph illustrating the operation of the power noise filter of FIG. 5.

FIG. 6 is a Bode magnitude plot graph illustrating an example operation of the power noise filter of FIG. 5. Values (e.g., "A", "B", "w1", and "w2") on the Bode plot graph may be positive integers. The X axis represents frequency, and the Y axis represents the magnitude of the supply voltage Vpa. FIG. 6 is a graph of the magnitude (in decibels (dB)) of the supply voltage Vpa versus frequency.

Referring to FIGS. 5 and 6, the supply voltage Vpa may be output (e.g., to the power amplifier 400 of FIG. 2) through the first low pass filter LPF1 at a level of "A" dB at low frequencies up to a first frequency w1.

Noise generated in the output voltage Vout at a second frequency w2 may be reduced or eliminated with the use of the first band stop filter BSF1 such that the supply voltage Vpa may have a level of B dB, which is lower than A dB, at the second frequency w2.

Damping may occur in the supply voltage Vpa obtained by the power noise filter 240-1, at the first frequency w1. As a result, ringing or oscillation may occur.

Figure 7:
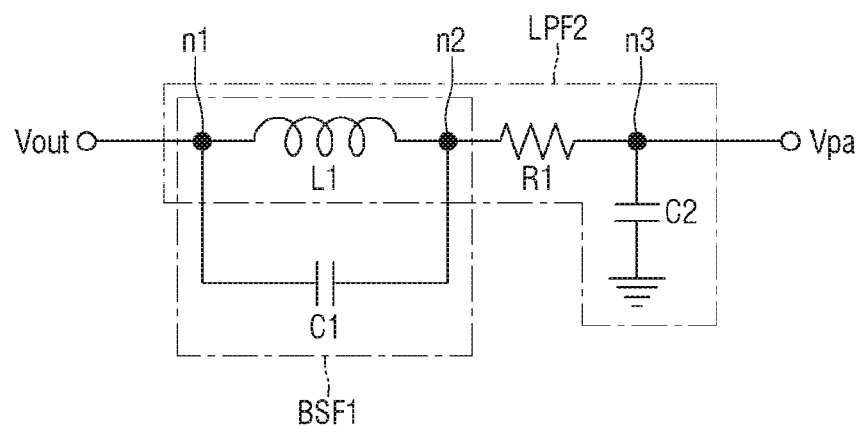
FIG. 7 is a circuit diagram of another power noise filter according to some embodiments of the present disclosure.

To address the ringing or oscillation, a power noise filter 240-2 of FIG. 7 may be provided.

FIG. 7 is a circuit diagram of another power noise filter, 240-2, according to some embodiments of the present disclosure. The power noise filter 240-2 outputs a supply voltage Vpa (e.g., to the power amplifier 400 of FIG. 2) through a third node n3. The power noise filter 240-2 differs from that of FIG. 5 by including a first resistor R1 between a second node n2 and the third node n3.

Thus, a second low pass filter LPF2 of the power noise filter 240-2 may include a first inductor L1, the first resistor R1, and a second capacitor C2.

The supply voltage Vpa obtained by the power noise filter 240-2 will hereinafter be described with reference to FIG. 8.

Figure 8:
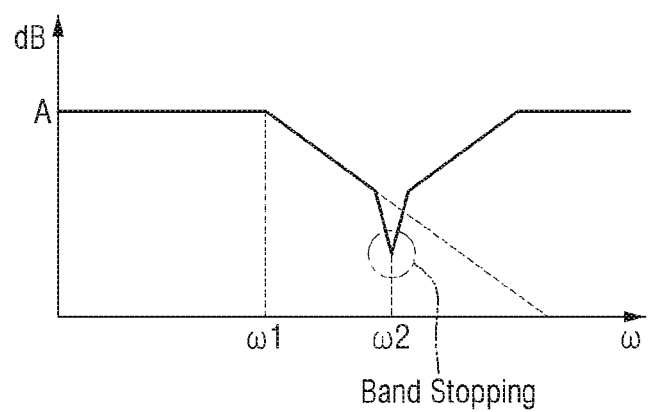
FIG. 8 is a Bode plot graph illustrating the operation of the power noise filter of FIG. 7.

FIG. 8 is a Bode magnitude plot graph illustrating the operation of the power noise filter of FIG. 7. Referring to FIGS. 7 and 8, damping caused by the power noise filter 240-1 can be reduced or eliminated by including the first resistor R1 of the power noise filter 240-2.

However, the power noise filter 240-2 may cause power loss due to the resistor R1. To address this, a power noise filter 240-3 of FIG. 9 may be provided.

FIGS. 9 through 16 are circuit diagrams of power noise filters according to some embodiments of the present disclosure.

Figure 9:
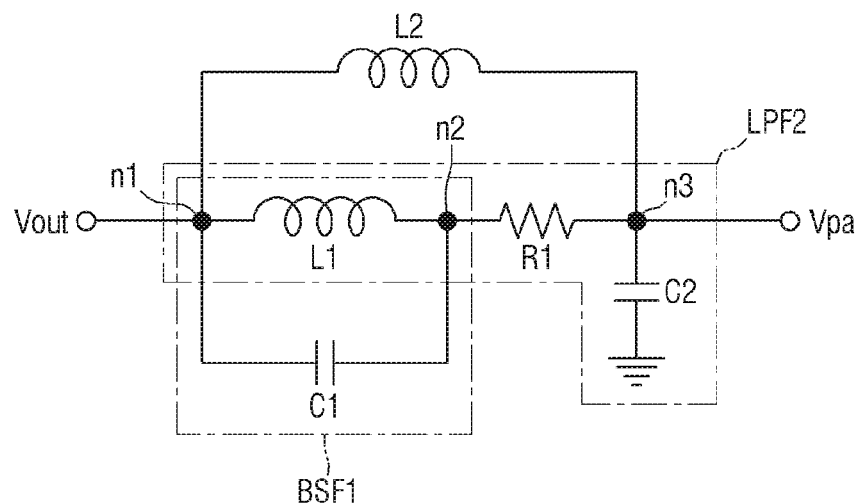
FIGS. 9, 10, 11, 12, 13, 14, 15 and 16 are circuit diagrams of respective power noise filters according to some embodiments of the present disclosure.

Referring to FIG. 9, the power noise filter 240-3 may differ from the power noise filter 240-2 by further including a second inductor L2 between the first node n1 and the third node n3. The inductance of the second inductor L2 is greater than the inductance of the inductor L1.

Because a DC path is added by the second inductor L2, power loss that may be caused by a first resistor R1 may be reduced. Accordingly, the power noise filter 240-3 can reduce power loss while preserving the characteristic illustrated in FIG. 8.

The location of the first resistor R1 is not particularly limited, and this will hereinafter be described with reference to FIG. 10.

Figure 10:
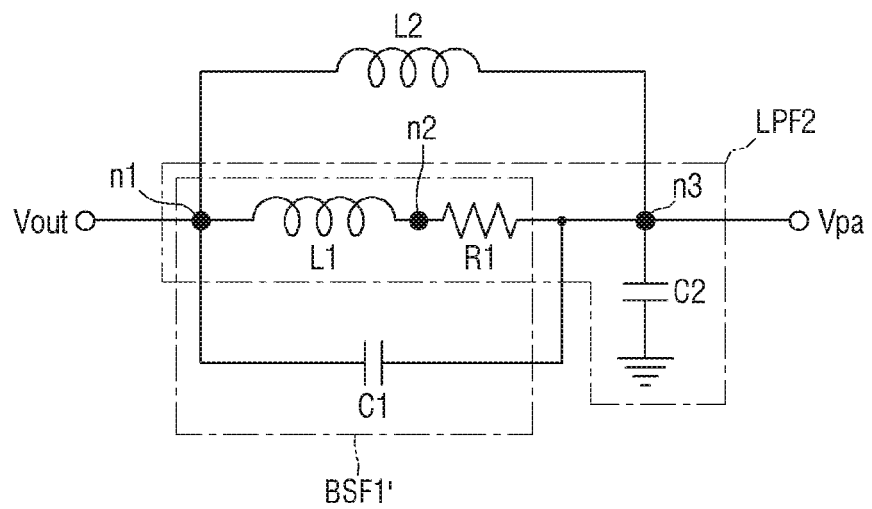

Referring to FIG. 10, a power noise filter 240-4 may differ from the power noise filter 240-3 by providing the first resistor R1 connected in parallel to the first capacitor C1.

With the power noise filter 240-4, the first resistor R1 may be included in a first band stop filter BSF1'. In an alternative embodiment, the location of the resistor R1 is changed such that the resistor R1 is connected in parallel to the first capacitor C1.

Thus, the first resistor R1 may be located within the first band stop filter BSF1' (as in FIG. 10) or outside the first band stop filter BSF1 (as in FIGS. 7 and 9).

In some embodiments, a plurality of capacitors and a plurality of switches may be connected to a band stop filter of a power noise filter to flexibly control the frequency for eliminating or reducing noise, and this will hereinafter be described with reference to FIG. 11.

Figure 11:
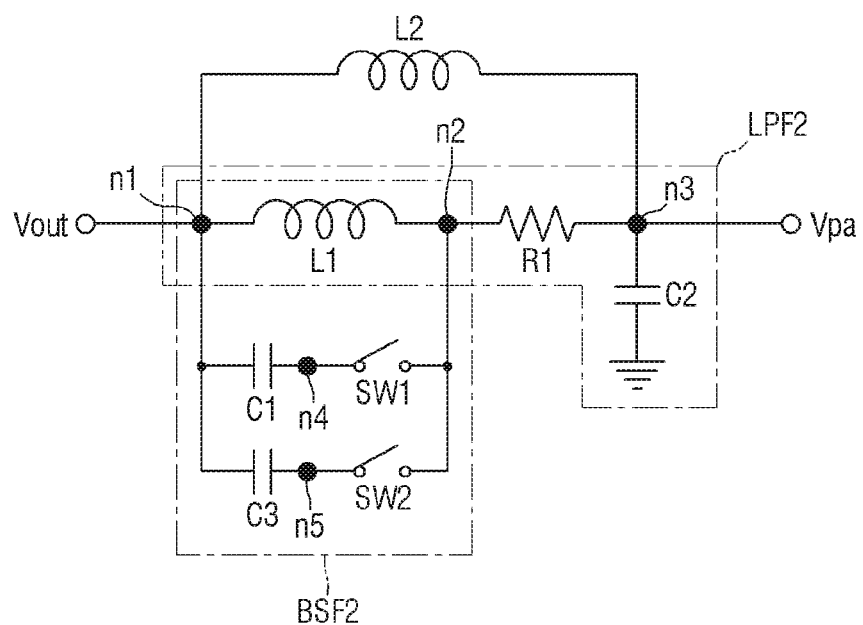

Referring to FIG. 11, a second band stop filter BSF2 of a power noise filter 240-5 includes a plurality of capacitors (e.g., first and third capacitors C1 and C3), which are connected in parallel to a first inductor L1, between first and second nodes n1 and n2. In other embodiments, three or more capacitors are connected in parallel to the first inductor L1.

A first switch SW1 may be connected in series between the first capacitor C1 and the second node n2. One end of the first capacitor C1 and one end of the first switch SW1 may be connected a fourth node n4.

A second switch SW2 may be connected in series between the third capacitor C3 and the second node n2. One end of the third capacitor C3 and one end of the second switch SW2 may be connected to a fifth node n5.

The second band stop filter BSF2 of the power noise filter 240-5 can reduce or eliminate noise by changing, in real time, the frequency at which noise included in an output voltage Vout is generated, via the first and third capacitors C1 and C3 and suitable switching of the first and second switches SW1 and SW2.

The configuration of the second band stop filter BSF2 of the power noise filter 240-5 may also be applicable to other power noise filters according to some embodiments of the present disclosure, e.g., the power noise filters 240-1 through 240-4 and power noise filters 240-7 through 240-9.

To flexibly control the band of frequencies that a low pass filter of a power noise filter passes therethrough, multiple capacitors and multiple switches may be connected to the low pass filter, and this will hereinafter be described with reference to FIG. 12.

Figure 12:
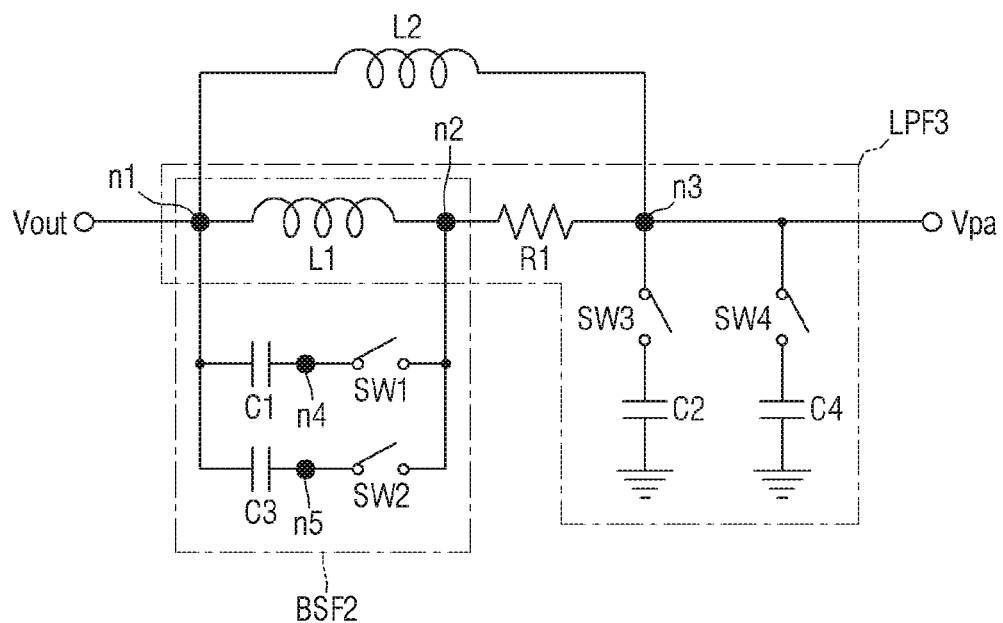

Referring to FIG. 12, a third low pass filter LPF3 of a power noise filter 240-6 includes a plurality of capacitors (e.g., second and fourth capacitors C2 and C4), which are connected in parallel between a third node n3 and a ground source. It is noted that the number of capacitors connected in parallel between the third node n3 and the ground source may differ from that shown in FIG. 12 in other embodiments.

The third switch SW3 may be connected in series between the second capacitor C2 and the third node n3. A fourth switch SW4 may be connected in series between the fourth capacitor C4 and the third node n3.

The third low pass filter LPF3 can change, in real time, a predetermined frequency of the output voltage Vpa for passing power below the predetermined frequency through the third low pass filter LPF3, via the second and fourth capacitors C2 and C4 and the third and fourth switches SW3 and SW4.

The configuration of the third low pass filter LPF3 of the power noise filter 240-6 may be applicable to other power noise filters according to some embodiments of the present disclosure.

A power noise filter may include multiple band stop filters, and this will hereinafter be described with reference to FIG. 13.

Figure 13:
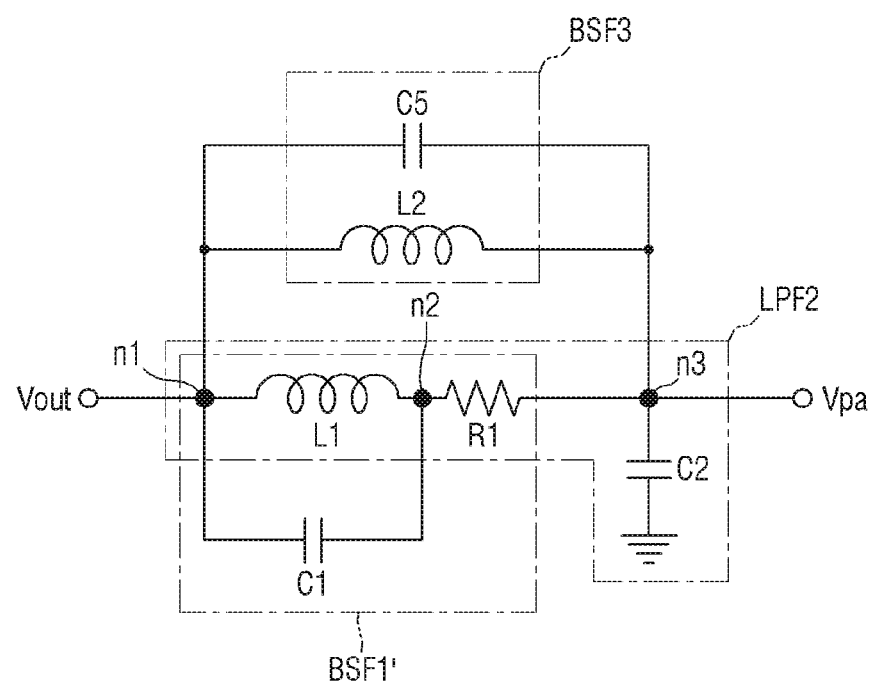

Referring to FIG. 13, a power noise filter 240-7 further includes a third band stop filter BSF3, which includes a second inductor L2 and a fifth capacitor C5 that are connected in parallel between first and third nodes n1 and n3.

Thus, the power noise filter 240-7 may include a first band stop filter BSF1 and may further include the third band stop filter BSF3. Accordingly, the power noise filter 240-7 can effectively filter noise occurring at a predetermined frequency of the voltage Vout input to the power noise filter 240-7.

The number of band stop filters included in the power noise filter 240-7 is not particularly limited. For example, the number of band stop filters included in the power noise filter 240-7 may be increased by increasing the number of pairs of inductors and capacitors connected in parallel between the first and third nodes n1 and n3.

The provision of multiple band stop filters in the power noise filters 240-7 may also be applicable to other power noise filters according to some embodiments of the present disclosure, e.g., the power noise filters 240-1 through 240-4 and power noise filters 240-8 and 240-9.

To reduce power loss in a power noise filter, a transistor may be further provided in the power noise filter, and this will hereinafter be described with reference to FIG. 14.

Figure 14:
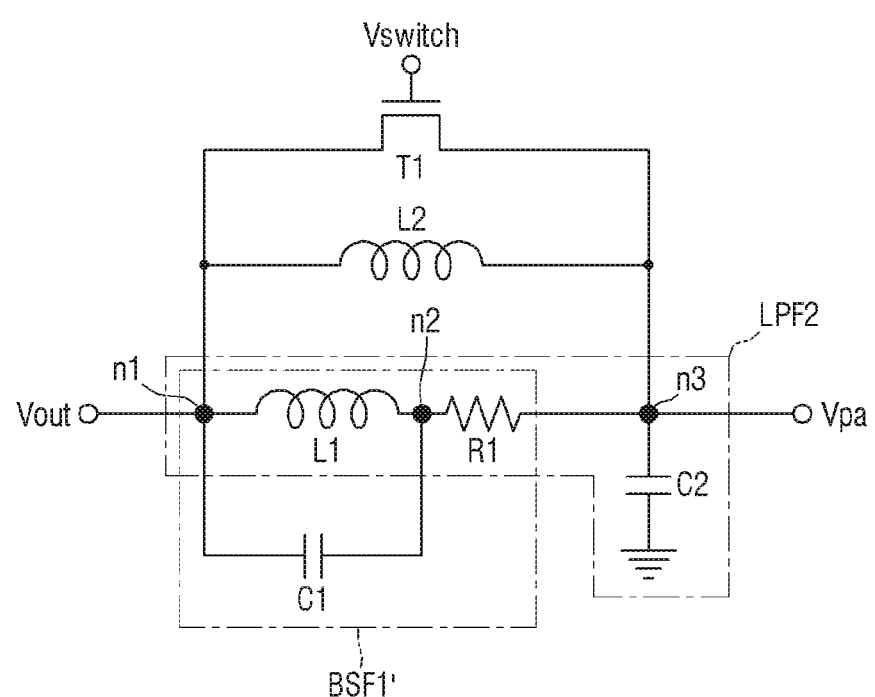

Referring to FIG. 14, the power noise filter 240-8 further includes a first transistor T1, which is connected between first and third nodes n1 and n3.

The on resistance of the first transistor T1 may be lower than the DC resistance of a second inductor L2. The first transistor T1 is turned on by a switch voltage Vswitch to provide a DC path and can thus reduce power loss in the power noise filter 240-8.

The provision of the first transistor T1 in the power noise filter 240-8 may also be applicable to other power noise filters according to some embodiments of the present disclosure, i.e., the power noise filters 240-1 through 240-7.

Figure 15:
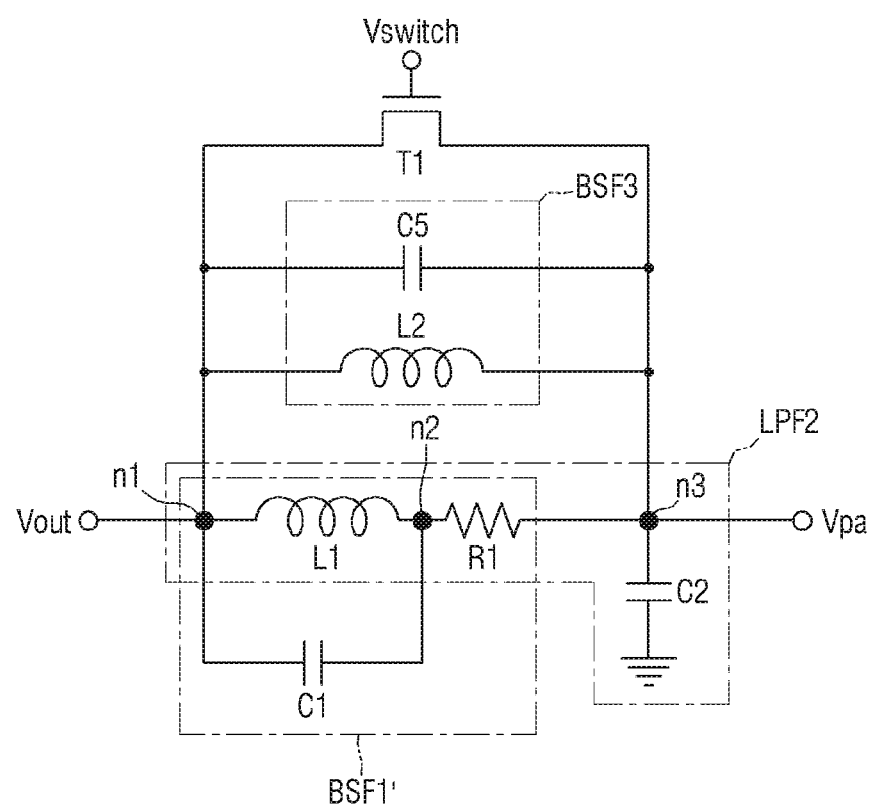

Referring to FIG. 15, a first transistor T1 may be further provided in the power noise filter 240-7 of FIG. 13, thereby obtaining the power noise filter 240-9.

Figure 16:
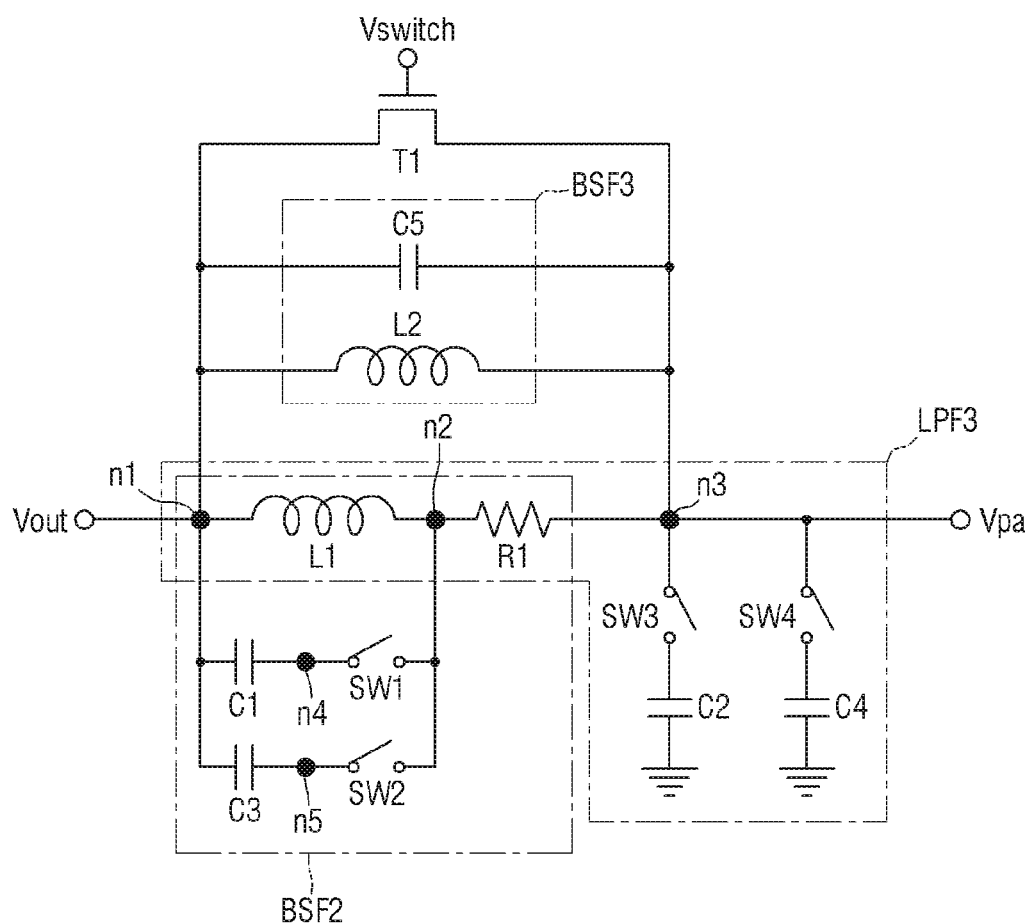

Also, referring to FIG. 16, a fifth capacitor C5 and a first transistor T1 may be further provided in the power noise filter 240-6 of FIG. 12, thereby obtaining the power noise filter 240-10.

Figure 17:
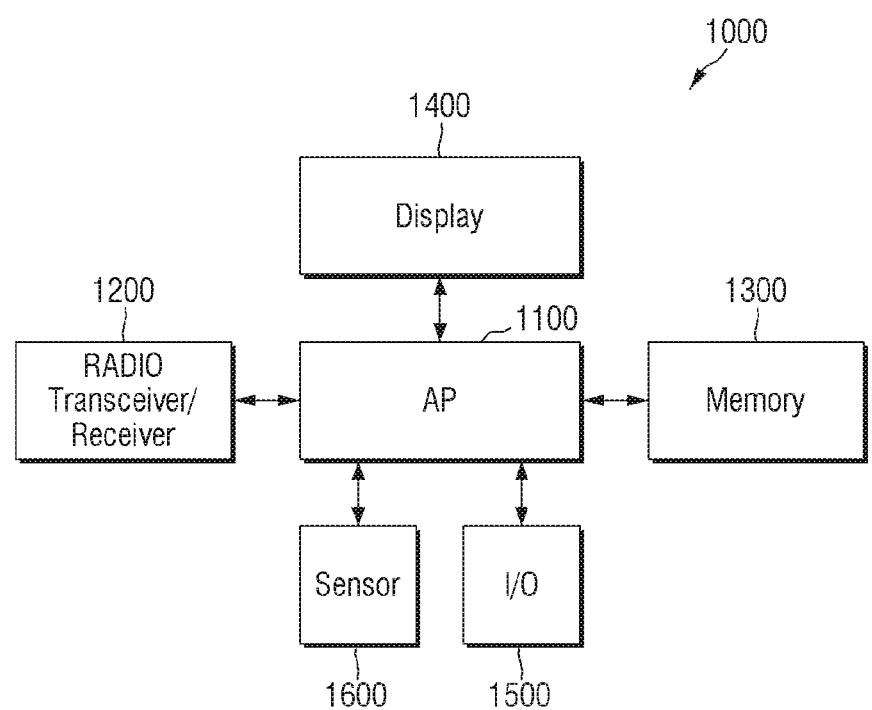
FIG. 17 is a block diagram of an IoT device according to some embodiments of the present disclosure.

FIG. 17 is a block diagram of an Internet of Things (IoT) device, 1000, according to some embodiments of the present disclosure. Any of the wireless communication devices described above with reference to FIGS. 1 through 16 may be included in an IoT device 1000. The IoT device 1000 may be used within a network between objects using wired/wireless communication technology. The IoT device 1000 may include a wired or wireless interface that accessible and may include devices communicating with one or more other devices via the wired or wireless interface to transmit or receive data. The wired or wireless interface may be an interface for a local area network (LAN), a wireless LAN (WLAN) such as WiFi, a wireless personal area network (WPAN) such as Bluetooth, a wireless universal serial bus (WUSB), Zigbee, Near-Field Communication (NFC), RFID, or Power Line Communication (PLC), or a modem communication interface that can access a mobile communication network such as 3G, 4G, 5G, or LTE. A Bluetooth interface may support Bluetooth Low Energy (BLE).

The IoT device 1000 may include a communication interface 1200 for communication with an external device. The communication interface 1200 may be a wireless communication interface for a LAN, Bluetooth, WiFi, or Zigbee or a modem communication interface that can access a wireless communication network such as 3G, 4G, 5G, or LTE. The communication interface 1200 may include a transceiver and/or a receiver. The IoT device 1000 may transmit information to, and/or receive information from, from an access point or a gateway. The IoT device 1000 may transmit control information or data to, or receive control information or data from, UE or another IoT device.

In some embodiments, the transceiver of the communication interface 1200 may transmit signals via multiple frequency bands, using carrier aggregation (CA) technology. To this end, the transceiver may include a plurality of power amplifiers, which amplify the power of a plurality of RF input signals, respectively, and a supply modulator, which provides a power supply voltage to the power amplifiers. The supply modulator may be implemented as described above with reference to FIGS. 1 through 16. Specifically, the supply modulator may reduce or eliminate noise in a supply voltage Vpa to be provided to the power amplifiers and may provide the noise-reduced (or noise-eliminated) supply voltage Vpa to the power amplifiers.

The IoT device 1000 may further include a processor or an application processor 1100 performing an operation. The IoT device 1000 may further include a power supply, which has a battery embedded therein or receives externally provided power to supply power to the other elements of the IoT device 1000. The IoT device 1000 may further include a display 1400, which displays information indicating the internal state of the IoT device 1000 or data. A user may control the IoT device 1000 via a user interface (UI) of the display 1400. The IoT device 1000 may transmit internal state information and/or data to the outside via the transceiver or may receive control commands and/or data from an external component via the receiver.

A memory 1300 may store control command code, control data, or user data for controlling the IoT device 1000. The memory 1300 may include at least one of a volatile memory or a nonvolatile memory. The nonvolatile memory may include at least one of a variety of memories such as a read-only memory (ROM), a programmable ROM (PROM), an electrically programmed ROM (EPROM), an electrically erasable and programmable ROM (EEPROM), a flash memory, a phase-change random-access memory (PRAM), a magnetic random-access memory (MRAM), a resistive random-access memory (ReRAM), and a ferroelectric random-access memory (FRAM). The volatile memory may include at least one of a variety of memories such as a dynamic random-access memory (DRAM), a static random-access memory (SRAM), and a synchronous DRAM (SDRAM).

The IoT device 1000 may further include a storage device. The storage device may be a nonvolatile medium such as a hard disk (HDD), a solid-state disk (SSD), an embedded multimedia card (eMMC), or a universal flash storage. The storage device may store user information provided via an input/output unit ("I/O") 1500 and sensing information collected by a sensor 1600.

Figure 18:
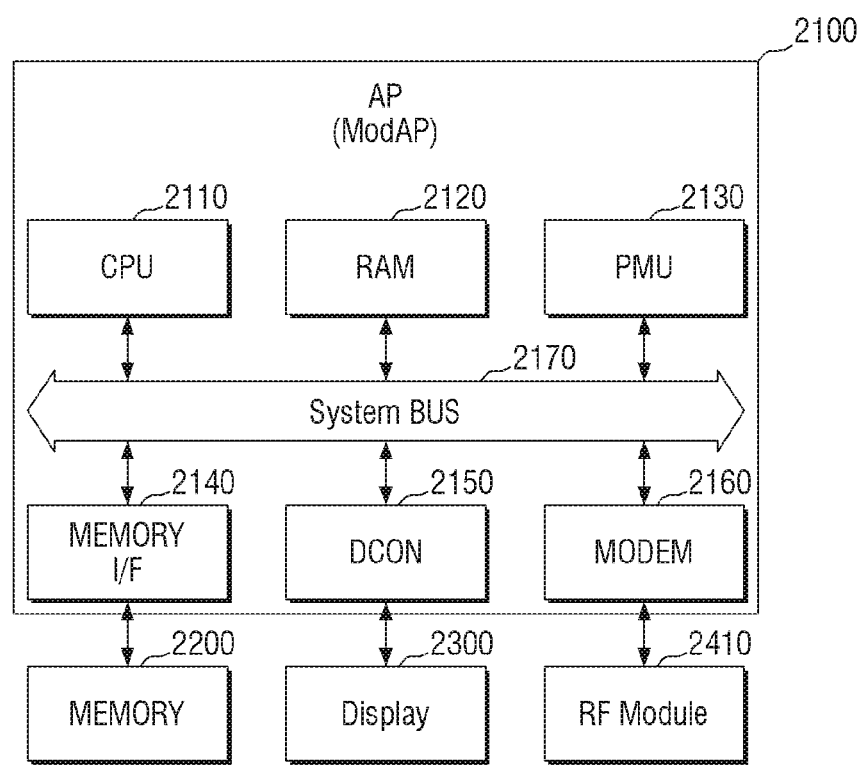
FIG. 18 is a block diagram of a mobile device according to some embodiments of the present disclosure.

FIG. 18 is a block diagram of a mobile device according to some embodiments of the present disclosure.

Referring to FIG. 18, a mobile device 2000 may include an application processor (AP) 2100, a memory 2200, a display 2300, and an RF module 2400. The mobile device 2000 may further include various other elements such as a lens, a sensor, an audio module, and the like.

The AP 2100 may be implemented as a system-on-chip (SoC) and may include a central processing unit (CPU) 2110, a RAM 2120, a power management unit 2130 (PMU), a memory interface 2140, a display controller 2150, a modem 2160, and a bus 2170. The AP 2100 may further include various Internet protocols (IPs). The AP 2100 may have a modem chip function incorporated thereinto and thus may also be referred to as a "ModAP".

The CPU 2110 may control the general operations of the AP 2100 and the mobile device 2000. The CPU 2110 may control the operation of each of the elements of the AP 2100. In some embodiments, the CPU 2110 may be implemented as a multicore, which is a single computing component having two or more independent cores.

The RAM 2120 may temporarily store programs, data, or instructions. For example, programs and/or data stored in the memory 2200 may be temporarily stored in the RAM 2120 under control of the CPU 2110 or in accordance with booting code of the CPU 2110. The RAM 2120 may be implemented as a DRAM or an SRAM.

The PMU 2130 may manage the power of each of the elements of the AP 2100. The PMU 2130 may determine the operating conditions of each of the elements of the AP 2100 and may thus control the operation of each of the elements of the AP 2100.

The memory interface 2140 may control the general operation of the memory 2200 and may also control the exchange of data between each of the elements of the AP 2100 and the memory 2200. The memory interface 2140 may write data to, or read data from, the memory 2200 in response to a request from the CPU 2110.

The display controller 2150 may transmit image data to be displayed on the display 2300 to the display 2300. The display 2300 may be implemented as a flat panel display such as a liquid crystal display (LCD) or an organic light-emitting diode (OLED) display or as a flexible display, but the present disclosure is not limited thereto.

For wireless communication, the modem 2160 may modulate data to be transmitted, to be compatible with a wireless environment, and may retrieve received data. The modem 2160 may perform digital communication with the RF module 2410.

The RF module 2410 may convert a high-frequency signal received via an antenna into a low-frequency signal and may transmit the low-frequency signal to the modem 2160. Also, the RF module 2410 may convert a low-frequency signal received from the modem 2160 into a high-frequency signal and may transmit the high-frequency signal to free space outside the mobile device 2000 via the antenna. Also, the RF module 2160 may amplify or filter signals.

In some embodiments, the RF module 2160 may transmit signals via multiple frequency bands, using the CA technology. To this end, the RF module 2160 may include a plurality of power amplifiers, which respectively amplify the power of a plurality of RF input signals corresponding to a plurality of carrier waves, and a supply modulator, which provides a power supply voltage to the power amplifiers. The supply modulator may be implemented as described above with reference to FIGS. 1 through 16. Specifically, the supply modulator may reduce or eliminate noise in a supply voltage to be provided to the power amplifiers and may provide the noise-reduced (or noise-eliminated) supply voltage to the power amplifiers.

Figure 19:
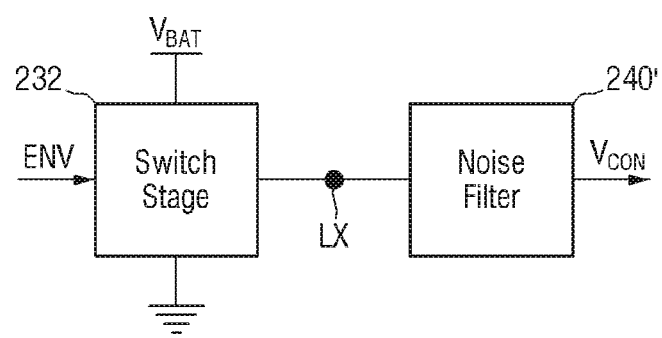
FIG. 19 is a block diagram of a DC-to-DC converter including a power noise filter according to some embodiments of the present disclosure.

FIG. 19 is a block diagram of a DC-to-DC converter, 230-1, which is an example of the DC-DC converter 230 of FIG. 3. The DC-DC converter 230-1 includes a switch state 232 and a power noise filter 240' having the same or similar configuration as any of the power noise filters 240 described above. The DC-DC converter 230-1 may receive a power supply voltage $V_{BAT}$, e.g., from a battery, and the envelope tracking signal ENV, and based thereon may generate a DC-to-DC converted signal VCON For example, the DC-DC converter 230-1 may be a Buck converter. The voltage at a node LX between the switch stage 232 and the power noise filter 240', may swing between the power supply voltage $V_{BAT}$ and a ground voltage due to the switch stage 232.

As the voltage at the node LX swings, noise may be generated. The noise generated at the node LX may be eliminated by the power noise filter 240', and the power at the node LX may be transmitted to the linear voltage generator 250 (FIG. 3).

Figure 20:
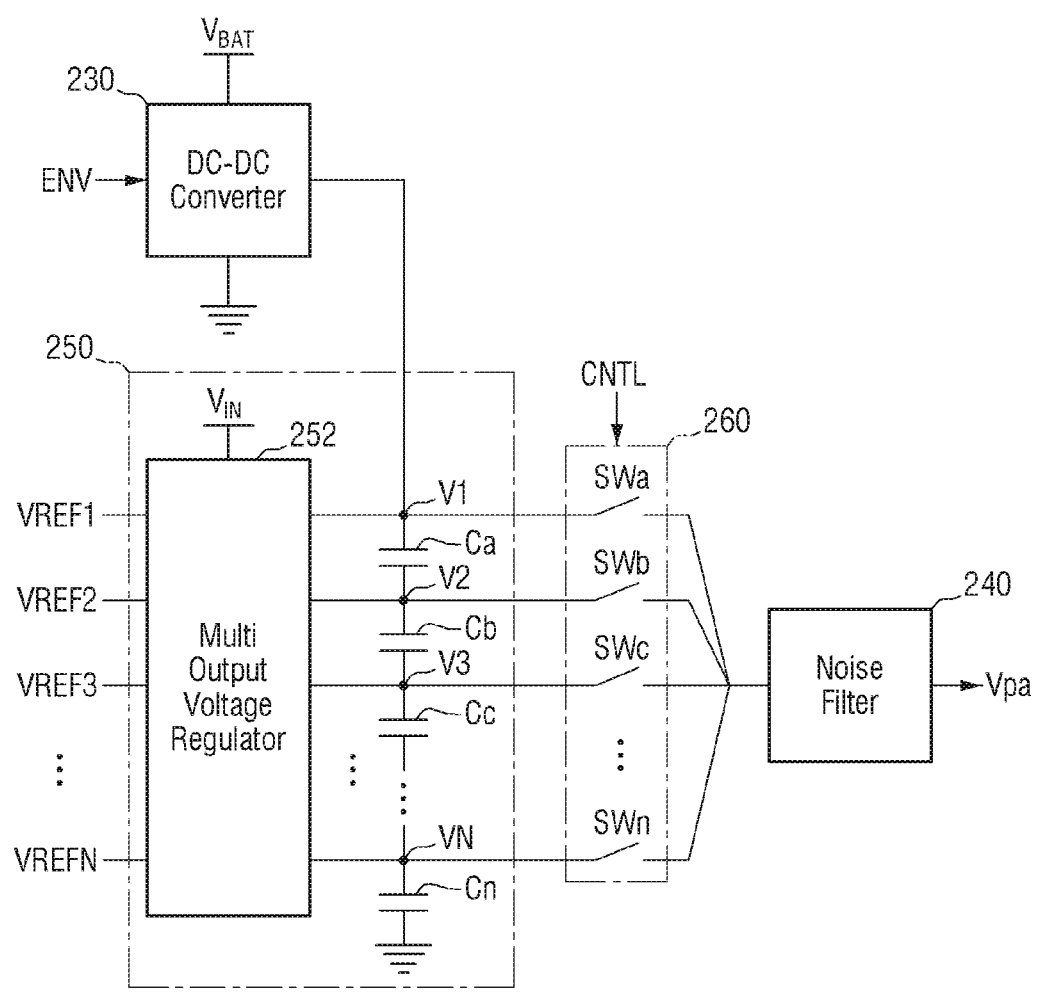
FIG. 20 is a block diagram of a supply modulator according to some embodiments of the present disclosure.

FIG. 20 is a block diagram of a supply modulator, 200-1, which is an example of the supply modulator 200 of FIG. 3.

Referring to FIG. 20, the linear voltage generator 250 may include a plurality of capacitors Ca through Cn and a multi-output voltage regulator 252.

The multi-output voltage regulator 252 may receive a plurality of reference output voltage signals VREF1 through VREFN (where N is two or more).

The multi-output voltage regulator 252 may boost or lower a power supply voltage $V_{IN}$, which is provided from, e.g., a battery, as an input voltage, based on the reference output voltage signals VREF1 through VREFN and may thereby generate and output a plurality of voltages V1 through VN having different levels. (Note that $V_{IN}$ may equal the battery voltage $V_{BAT}$ applied to the DC-DC converter 230.)

One of the voltages V1 through VN output from the multi-output voltage regulator 252 may be selected by the level selector 260. For example, one of the voltages V1 through VN, which are generated by and output from the multi-output voltage regulator 252 in, for example, a time-division manner, may be selected by the level selector 260, which includes a plurality of switches SWa through SWn (where n two or more), and the selected voltage may be provided to the power noise filter 240. The selected voltage may be chosen in accordance with a control signal CNTL applied to the level selector 260, such as the envelope tracking signal ENV.

The output end of the multi-output voltage regulator 252 may include a plurality of capacitors Ca through Cn corresponding to the voltages V1 through VN, respectively. It is noted that in other examples, the capacitors Ca through Cn may be located inside, rather than externally of, the multi-output voltage regulator 252.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. A power noise filter comprising:
   a band stop filter; and
   a low pass filter,
   wherein,
   the band stop filter includes an inductor and a first capacitor, which are connected in parallel between first and second nodes,
   the first node receives a first voltage, which is filtered by the band stop filter to thereby generate a second voltage at the second node, and
   the low pass filter includes the inductor and a second capacitor, wherein the second capacitor has: (i) one end directly connected to the second node or directly connected to a first end of a resistor and a third node, wherein a second end of the resistor is directly connected to the second node, and (ii) an opposite end of the second capacitor is connected to a ground source.

2. The power noise filter of claim 1, wherein:
the low pass filter further includes the resistor, the first end of the resistor is connected to the third node and the second end of the resistor is connected to the second node,
the one end of the second capacitor is directly connected to the first end of the resistor, and
a filtered supply voltage is output at the third node from the power noise filter.

3. The power noise filter of claim 1, wherein:
the band stop filter further includes the resistor, and
the one end of the second capacitor is directly connected to the first end of the resistor.

4. The power noise filter of claim 1, wherein the band stop filter further includes a third capacitor, which is connected in parallel with the inductor and the first capacitor, between the first and second nodes, a first switch, which is connected in series with the first capacitor, between the first capacitor and the second node, and a second switch, which is connected in series with the third capacitor, between the third capacitor and the second node.

5. The power noise filter of claim 1, wherein the low pass filter further includes a third capacitor, which is connected in parallel with the second capacitor, between the second node and the ground source, a first switch, which is connected in series with the second capacitor, between the second capacitor and the second node, and a second switch, which is connected in series with the third capacitor, between the third capacitor and the second node.

6. The power noise filter of claim 1, wherein the one end of the second capacitor is directly connected to the second node.

7. A power noise filter comprising:
a band stop filter;
a low pass filter;
a second inductor;
wherein,
the band stop filter includes a first inductor and a first capacitor, which are connected in parallel between first and second nodes,
the first node receives a first voltage, which is filtered by the band stop filter to thereby generate a second voltage at the second node,
the low pass filter includes:
the first inductor and a second capacitor, which has one end connected to a third node and an opposite end connected to a ground source; and
a resistor connected between the second node and the third node, wherein a filtered supply voltage is output at the third node from the power noise filter,
wherein the second inductor is connected between the first and third nodes.

8. The power noise filter of claim 7, wherein the band stop filter is a first band stop filter, and the power noise filter further comprising:
a second band stop filter,
wherein the second band stop filter includes the second inductor and a third capacitor, which is connected between the first and third nodes and is connected in parallel with the second inductor.

9. The power noise filter of claim 7, further comprising:
a transistor connected between the first and third nodes and connected in parallel with the second inductor.

10. A supply modulator comprising: a direct current-to-direct current (DC-to-DC) converter configured to receive an envelope tracking signal and to generate a maximum voltage corresponding to a maximum level of the envelope tracking signal; a linear voltage generator configured to linearly convert and distribute the maximum voltage; a level selector configured to generate an output voltage that fits the envelope tracking signal; and a power noise filter configured to generate a supply voltage by reducing or eliminating power noise in the output voltage, wherein the power noise filter includes a band stop filter and a low pass filter, the band stop filter includes an inductor and a first capacitor, which are connected in parallel between first and second nodes, the first node receives the output voltage from the level selector, a filtered voltage is provided at the second node, and the low pass filter includes the inductor and a second capacitor, wherein the second capacitor has: (i) one end directly connected to the second node or directly connected to a first end of a resistor and a third node, wherein a second end of the resistor is directly connected to the second node, and (ii) an opposite end connected to a ground source.

11. The supply modulator of claim 10, wherein:
the low pass filter further includes the resistor, the first end of the resistor is connected to the third node and the second end of the resistor is connected to the second node,
the one end of the second capacitor is directly connected to the first end of the resistor, and
a filtered supply voltage is output at the third node from the power noise filter.

12. The supply modulator of claim 11, wherein the inductor is a first inductor and the power noise filter further comprising:
a second inductor, which is connected between the first and third nodes.

13. The supply modulator of claim 10, wherein:
the band stop filter further includes the resistor, and
the one end of the second capacitor is directly connected to the first end of the resistor.

14. The supply modulator of claim 10, wherein the band stop filter further includes a third capacitor, which is connected in parallel with the inductor and the first capacitor, between the first and second nodes, a first switch, which is connected in series with the first capacitor, between the first capacitor and the second node, and a second switch, which is connected in series with the third capacitor, between the third capacitor and the second node.

15. The supply modulator of claim 10, wherein the low pass filter further includes a third capacitor, which is connected in parallel with the second capacitor, between the second node and the ground source, a first switch, which is connected in series with the second capacitor, between the second capacitor and the second node, and a second switch, which is connected in series with the third capacitor, between the third capacitor and the second node.

16. A wireless communication device comprising:
a modem configured to generate an envelope tracking signal and a transmission signal;
a radio frequency integrated circuit (RFIC) configured to generate a radio frequency (RF) signal by modulating a carrier wave with the transmission signal;
a power amplifier configured to amplify the RF signal; and
a supply modulator configured to receive the envelope tracking signal and output a supply voltage to the power amplifier,
wherein
the supply modulator includes a direct current-to-direct current (DC-to-DC) converter, which receives the envelope tracking signal and generates a maximum voltage corresponding to a maximum level of the envelope tracking signal, a linear voltage generator, which linearly converts and distributes the maximum voltage, a level selector, which generates an output voltage that fits the envelope tracking signal, and a power noise filter, which generates a supply voltage by reducing or eliminating power noise in the output voltage, and the power noise filter includes a band stop filter and a low pass filter, the band stop filter includes an inductor and a first capacitor, which are connected in parallel between first and second nodes, the first node receives the output voltage from the level selector, a filtered version of the output voltage is provided at the second node, and the low pass filter includes the inductor and a second capacitor, wherein the second capacitor has: (i) one end directly connected to the second node or directly connected to a first end of a resistor and a third node, wherein a second end of the resistor is directly connected to the second node, and (ii) an opposite end of the second capacitor is connected to a ground source.

17. The wireless communication device of claim 16, wherein:

the low pass filter further includes the resistor, the first end of the resistor is connected to the third node and the second end of the resistor is connected to the second node, the one end of the second capacitor is directly connected to the first end of the resistor, and the supply voltage is output at the third node from the supply modulator.

18. The wireless communication device of claim 17, wherein the inductor is a first inductor, and the wireless communication device further comprising:

a second inductor, which is connected between the first and third nodes.

19. The wireless communication device of claim 16, wherein:

the band stop filter further includes the resistor, and the one end of the second capacitor is directly connected to the first end of the resistor.

20. The wireless communication device of claim 16, wherein the band stop filter further includes a third capacitor, which is connected in parallel to the inductor and the first capacitor, between the first and second nodes, a first switch, which is connected in series with the first capacitor, between the first capacitor and the second node, and a second switch, which is connected in series with the third capacitor, between the third capacitor and the second node.

21. The wireless communication device of claim 16, wherein the low pass filter further includes a third capacitor, which is connected in parallel with the second capacitor, between the second node and the ground source, a first switch, which is connected in series with the second capacitor, between the second capacitor and the second node, and a second switch, which is connected in series with the third capacitor, between the third capacitor and the second node.

* * * * *